(12) United States Patent
Hung et al.

(10) Patent No.: US 8,213,210 B2
(45) Date of Patent: Jul. 3, 2012

(54) MAGNETIC SHIFT REGISTER AND READING METHOD

(75) Inventors: Chien-Chung Hung, Taipei (TW); Ching-Hsiang Tsai, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 387 days.

(21) Appl. No.: 12/564,925

(22) Filed: Sep. 23, 2009

(65) Prior Publication Data
US 2010/0321974 A1 Dec. 23, 2010

(30) Foreign Application Priority Data
Jun. 23, 2009 (TW) ................................ 98121014 A (51) Int. Cl.
*G11C 19/08* (2006.01)
(52) U.S. Cl. ................ 365/88; 365/80; 365/85; 365/89; 365/157; 365/171
(58) Field of Classification Search ............. 365/80–938
See application file for complete search history.

(56) References Cited

U.S. PATENT DOCUMENTS

| | | | |
|---|---|---|---|
| 6,834,005 B1 | 12/2004 | Parkin | |
| 7,551,469 B1 * | 6/2009 | Parkin | 365/80 |
| 2006/0120132 A1 * | 6/2006 | Parkin | 365/80 |
| 2008/0080234 A1 * | 4/2008 | Iwata et al. | 365/171 |
| 2008/0137395 A1 | 6/2008 | Hwang et al. | |
| 2009/0207643 A1 * | 8/2009 | Joe et al. | 365/85 |

OTHER PUBLICATIONS

K. Miura et al., "A novel SPRAM (SPin-transfer torque RAM) with a synthetic ferrimagnetic free layer for higher immunity to read disturbance and reducing write-current dispersion," Symposium on VLSI Technology Digest of Technical Papers, 2007, pp. 234-235.
L. Thomas et al., "Oscillatory dependence of current-driven magnetic domain wall motion on current pulse length," Nature, vol. 443, pp. 197-200, Sep. 14, 2006.

* cited by examiner

*Primary Examiner* — Vu Le
*Assistant Examiner* — Han Yang
(74) *Attorney, Agent, or Firm* — Jianq Chyun IP Office (57) ABSTRACT

A magnetic shift register including at least one magnetic track is provided. Each magnetic track has at least one set of burst data formed by a plurality of consecutive magnetic domains. Each magnetic domain has a magnetization direction corresponding to a stored data. A head magnetic domain having a given magnetization direction corresponding to a given stored data is set at a most front of the set of burst data, and the head magnetic domain and the set of burst data form a data storage unit. A method for reading a magnetic shift register is provided.

17 Claims, 10 Drawing Sheets

MAGNETIC SHIFT REGISTER AND READING METHOD

CROSS-REFERENCE TO RELATED APPLICATION

This application claims the priority benefit of Taiwan application serial no. 98121014, filed on Jun. 23, 2009. The entirety of the above-mentioned patent application is hereby incorporated by reference herein and made a part of specification.

BACKGROUND

1. Technical Field

The disclosure relates to a magnetic shift register and a reading method thereof.

2. Technical Art

A magnetic random access memory (MRAM) has advantages of non-volatile, high density, high accessing speed and anti-radiation, etc., which can be used to substitute a conventional semiconductor memory and used for embedded memory applications. The conventional magnetic field writing MRAM device applies metal wires for conducting currents and inducing the magnetic field, so as to switch a free layer of the MRAM. However, as a size of the MRAM decreases, a demagnetizing field effect is quickly increased, and a required write current is greatly increased, so that miniaturization of the MRAM is difficult.

Recently, a spin-torque-transfer (STT) switching technique is provided according to the MRAM technique, which is also referred to as a spin-RAM technique. Such technique is a new generation of magnetic memory writing technique, by which the write current directly flows through a memory cell, and as a size of the memory cell decreases, the required write current accordingly decreases, so that such kind of memory can be perfectly miniaturized. However, such STT switching technique still has disadvantages of inadequate thermal stability of devices, excessive write current, and uncertainty of reliability, etc., resulting in enormous obstacles for mass production of such kind of memory.

In addition, a current-driven domain wall motion theory is gradually disclosed and well developed according to the conventional technique during 1998-2004. A U.S. Pat. No. 6,834,005B1 provides a device structure which can greatly improve a data storage capacity, and the device structure is referred to as a magnetic shift register. Such kind of memory has a chance to substitute a current dynamic random access memory (DRAM), a static random access memory (SRAM) and a flash chip, and can even implement a technique of "disk drive on a chip". Such memory mainly applies a magnetic record disk similar to a hard disk, which is folded in a three-dimensional stack for storing data, in which the current drives a domain wall motion to record information therein. Therefore, an equivalent bit size thereof can be greatly reduced, and an operation speed thereof exceeds that of a solid flash chip and a hard disk.

Figure 1A:
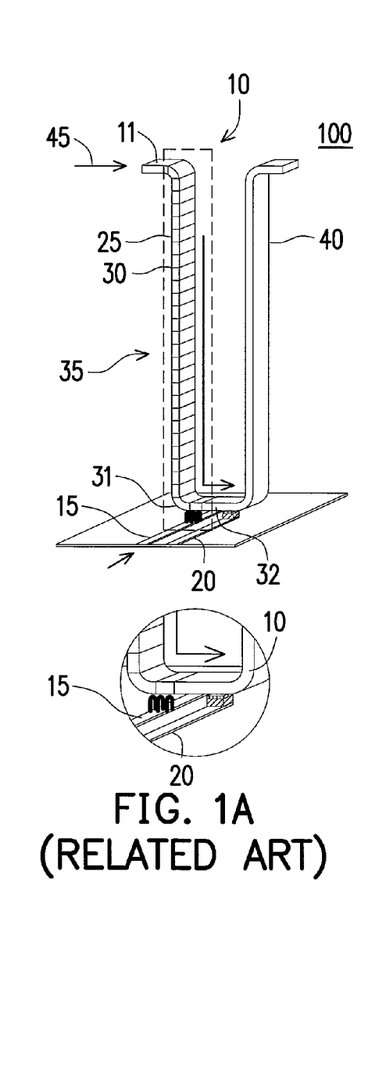
FIGS. 1A-1C are operational schematic diagrams of a conventional magnetic shift register.
Figure 1B:
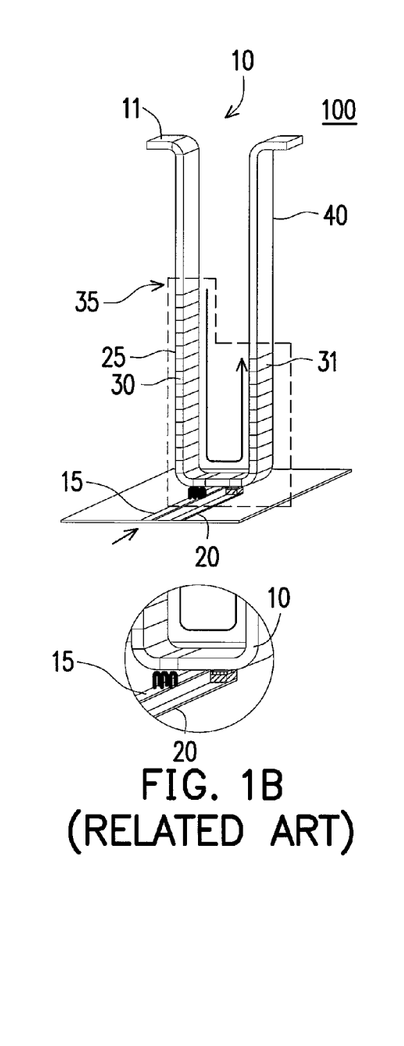
Figure 1C:
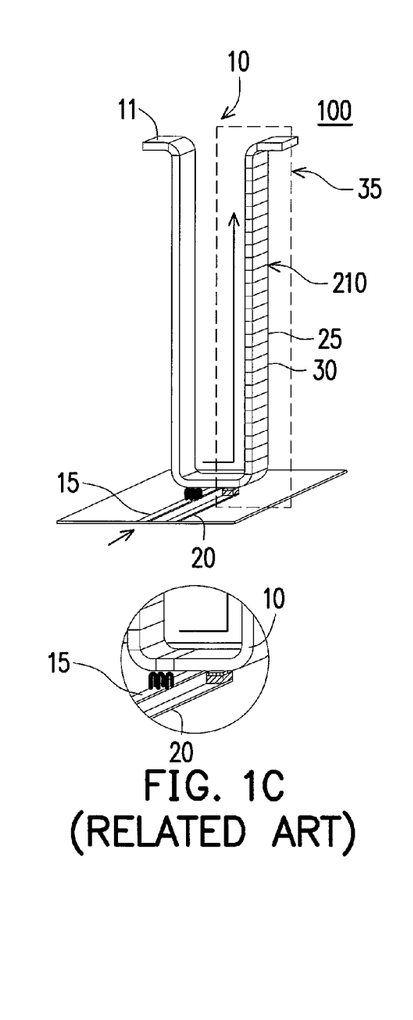

FIGS. 1A-1C are operational schematic diagrams of a conventional magnetic shift register. A shift register 100 includes a bit storage region 35, a bit reservoir region 40, a write device 15, a read device 20 and a track 11 for storing and moving data. The shift register 100 is formed by a magnetic metal material such as ferromagnetic materials of NiFe, and CoFe, etc. The track 11 can be magnetized into a plurality of small magnetic domains 25 and 30. Directions of magnetization vectors of the magnetic domains represent logic values 0 and 1 of the stored information. The track 11 of the shift register 100 is serially connected to adjacent tracks. A memory region is separated by one set of the write device 15 and the read device 20, and each of the memory regions includes the bit storage region 35 and the bit reservoir region 40. During a quiescent state for storing information, i.e., a stable state without applying the current to drive a domain wall motion, data of the memory cells (for example, the magnetic domain 25 represents data 0 and the magnetic domain 30 represents data 1) are sequentially stored in the bit storage region 35. Now, none information is stored in the bit reservoir region 40. The read device 20 of the magnetic shift register is connected to the track 11 via a magnetic tunnelling junction (MTJ), and when the sequential bit information is about to be read, a current pulse 45 is input to drive each of the magnetic domains 25 and 30 to generate a domain wall motion (DWM) towards a direction of the electron flow.

FIG. 1B illustrates a transient state, in which the bit information located closest to the read device 20 can be read. In this transient state, the previously read bit information is shifted into the bit reservoir region 40. After all of the bit information stored in the bit storage region 35 is read, all of the bit information is shifted to the bit reservoir region 40. Then, an inverted current pulse 45 is input to shift all of the bit information back to the bit storage region 35. When data is written into the magnetic shift register, the magnetic domain to be written with the data is also shifted to a position where the write device 15 is located by inputting the current pulse 45, and now the write device 15 also shifts a fringe field of a specific direction to a write position via another writing line according to the DWM, so that the magnetic domain is switched to a direction of the data to be written. Thereafter, the sequential information of the magnetic domain is shifted back to an original position via the inverted current pulse 45. According to a common knowledge of the memory, the read device 20 is connected to a sense amplifier through a select transistor (which can be a MOS transistor), wherein the transistor occupies a physical area of a Si substrate. Sizes of the magnetic domains 25 and 30 are generally far more smaller than that of the transistor, so that an equivalent bit size of the magnetic shift register is mainly determined by the size of the transistor and a number of the bit information (25 and 30) stored in the bit storage region 35 that is controlled by the transistor. Since the magnetic shift register includes a plurality of bits, the equivalent bit size can be greatly reduced.

Figure 2:
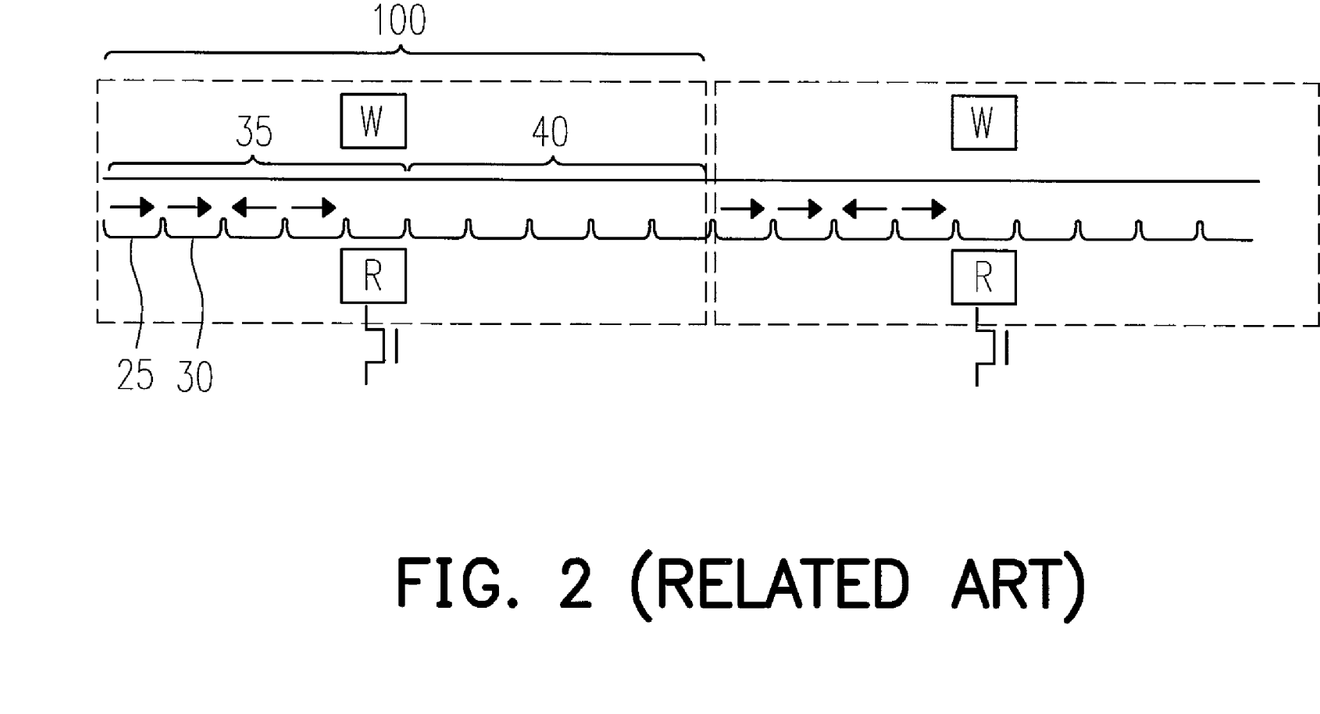
FIG. 2 is a schematic diagram illustrating a mechanism of a magnetic shift register of FIGS. 1A-1C.
Figure 3:
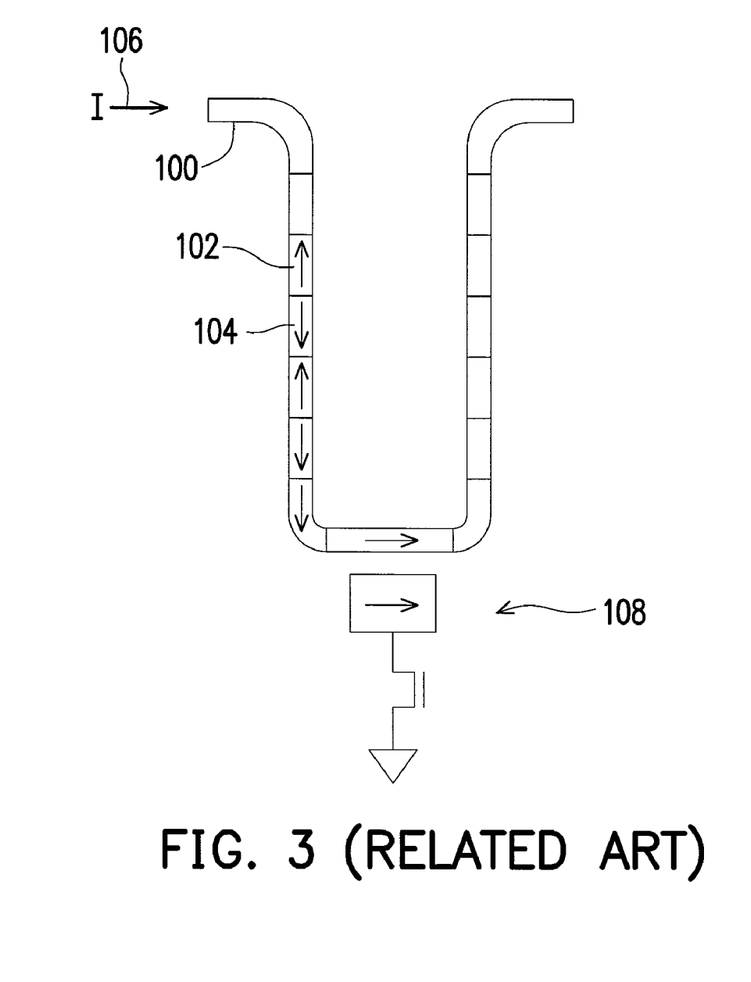
FIG. 3 is a schematic diagram illustrating a read mechanism.

FIG. 2 is a schematic diagram illustrating a mechanism of the magnetic shift register of FIGS. 1A-1C. Referring to FIG. 2, for simplicity's sake, the shift register 100 can be extended on a straight track, which includes the bit storage region 35 and the bit reservoir region 40 respectively containing a plurality of the magnetic domains 25 and 30. Assuming in FIG. 2, one bit storage region 35 of the shift register 100 records data of four bits that can be shifted to the bit reservoir region 40. FIG. 3 is a schematic diagram illustrating a read mechanism. Referring to FIG. 3, a current pulse 106 is, for example, input to the shift register 100, so that the magnetic domains 102 and 104 are shifted, and a read device 108 can read bit data from one of the magnetic domains passing through a position where the reading circuit 108 is located. Data to be written into the magnetic domain can be written by a writing circuit.

Figure 4:
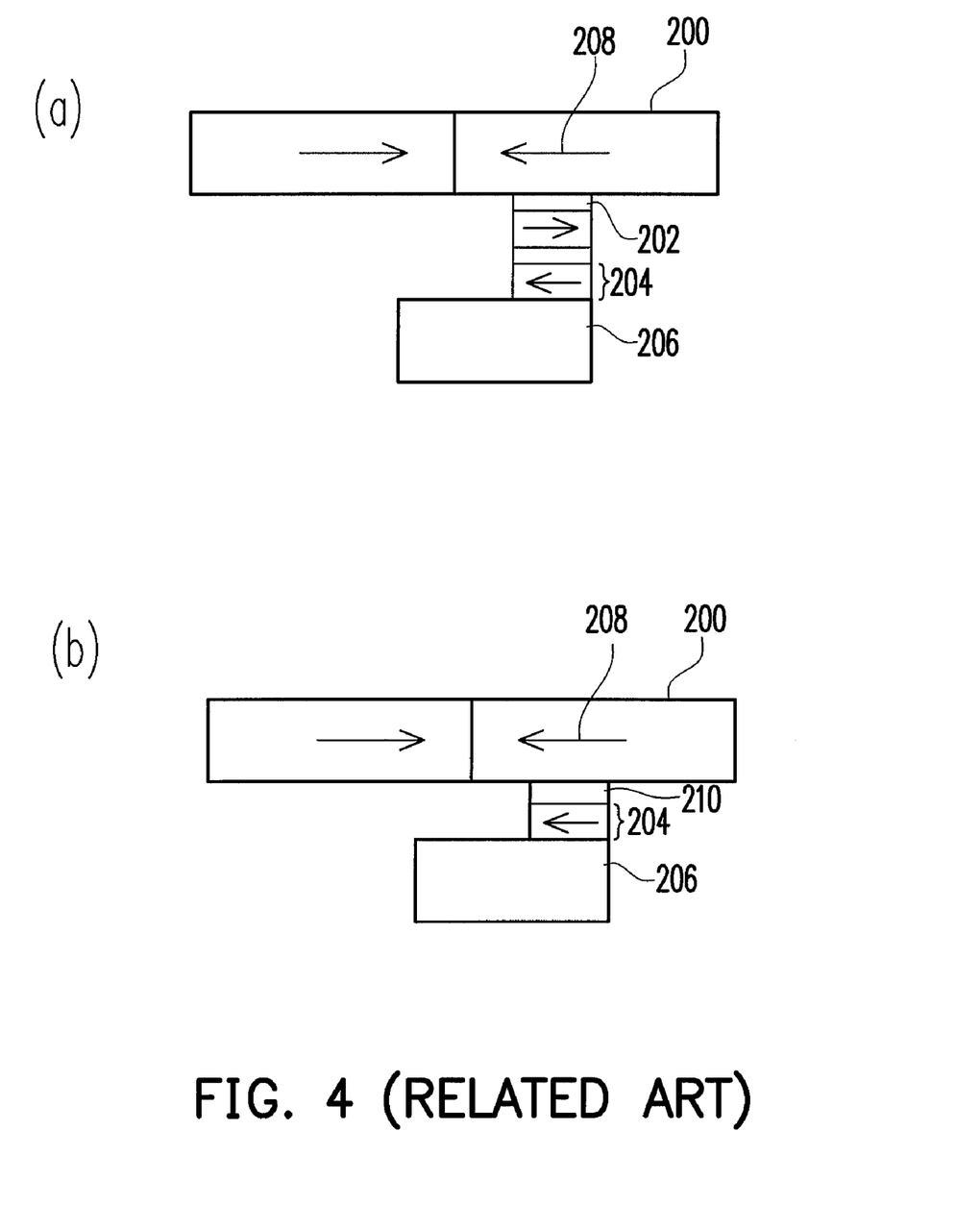
FIG. 4 is a schematic diagram illustrating a conventional mechanism for reading data stored in a magnetic domain.

FIG. 4 is a schematic diagram illustrating a conventional mechanism for reading data stored in a magnetic domain. Referring to FIG. 4(a), according to the read mechanism of FIG. 3, a metal electrode 206 is generally used to connect the read device to a peripheral reading circuit (not shown), and a magnetization pinned reference layer 204 of a magnetoresistance read device can be, for example, a pinned reference layer of a MTJ device. The MTJ device includes a free layer structure, a tunnelling barrier and the pinned reference layer structure. The MTJ device contacts a magnetic domain to be read through a magnetic coupling metal structure 202, so as to couple and sense a magnetization direction 208 in the magnetic domain. In other words, the magnetoresistance read device is connected to a corresponding magnetic domain through the magnetic coupling metal structure 202. Referring to FIG. 4(b), another magnetoresistance read device includes a pinned reference layer 204 with a fixed magnetization direction, which directly contacts the magnetic domain through a tunnelling barrier 210, so as to sense the magnetization direction 208 of the magnetic domain, i.e. the magnetization direction 208 the tunnelling barrier 210 and the pinned reference layer 204 form the MTJ device, and the magnetization direction 208 also serves as the free layer of the MTJ device.

In other words, the conventional method of reading the stored data is implemented by directly coupling or detecting the magnetization direction of the magnetic domain, so that the magnetic coupling metal structure 202 is required. If the pinned reference layer 204 of the magnetoresistance read device is too closed to the magnetic domain, the fringe field of the magnetoresistance read device may probably interfere a normal DWM on the magnetic track.

Namely, the conventional reading method still has problems, and developers are still seeking other possible designs and methods.

SUMMARY

The embodiment provides a magnetic shift register including at least one magnetic track. Each magnetic track has at least one set of burst data formed by a plurality of consecutive magnetic domains. Each magnetic domain has a magnetization direction corresponding to a stored data. A head magnetic domain having a given magnetization direction corresponding to a given stored data is set at a most front of the set of burst data, and the head magnetic domain and the set of burst data form a data storage unit.

The another embodiment provides a method for reading a magnetic shift register, wherein the magnetic shift register includes at least one magnetic track, wherein each magnetic track has at least one set of burst data formed by a plurality of consecutive magnetic domains, and each magnetic domain has a magnetization direction corresponding to a stored data; a head magnetic domain having a given magnetization direction is set at a most front of the set of burst data; and a read device is disposed at a boundary of an adjacent magnetic domain for detecting a fringe field state. The reading method includes sequentially shifting the stored data of the magnetic domains on the magnetic track towards the head magnetic domain, and performing a read operation for each shifting. The read operation includes following steps. First, the read device read the stored data of a first magnetic domain, wherein the data is determined according to the fringe field state generated by the head magnetic domain and the first magnetic domain of the set of burst data. Next, the other stored data of the set of burst data is sequentially read, wherein with reference of the stored data of the first magnetic domain and a rule, the stored data in the current magnetic domain is determined by the read stored data in the previous magnetic domain according to the currently detected fringe field state.

The another embodiment provides a method for reading a magnetic shift register, wherein the magnetic shift register includes at least one magnetic track. Each magnetic track has at least one set of burst data formed by a plurality of consecutive magnetic domains. Each magnetic domain has a magnetization direction corresponding to a stored data. The reading method includes following steps. First, a plurality of interfaces between the magnetic domains sequentially is moved to pass through a read position. The stored data of the magnetic domains is shifted one bit at a time, so that the set of burst data sequentially passes through the read position according to motions of the magnetic domains. Next, it is detected whether there is a fringe field at the read position, and the stored data of the currently read magnetic domain is determined according to a rule, wherein the rule includes that if no fringe field is detected at the read position, the stored data of the currently read magnetic domain is the same to the stored data of the previous magnetic domain, and if the fringe field is detected at the read position, the stored data of the currently read magnetic domain is inversed to the stored data of the previous magnetic domain.

BRIEF DESCRIPTION OF THE DRAWINGS

The accompanying drawings are included to provide a further understanding of the embodiment, and are incorporated in and constitute a part of this specification. The drawings illustrate embodiments and, together with the description, serve to explain the principles of the embodiment.

DESCRIPTION OF THE EMBODIMENTS

In the embodiment, in allusion to a horizontal anisotropic material or perpendicular anisotropic material magnetic shift register, a method of dynamically reading the magnetic shift register according to a domain wall fringe field is provided. The horizontal anisotropic material or the perpendicular anisotropic material magnetic shift register refers that a magnetization direction of a magnetic domain is parallel to or perpendicular to a magnetic track. A heading bit with a given data state is disposed before a burst data, and a first bit of the burst data is determined according to the domain wall fringe field and the given data state. Thereafter, a true state of each bit of the burst data is determined according to the domain wall fringe field and a previous given data state. By sensing the domain wall fringe field, problems of a magnetic interference and a difficult fabrication process caused by directly contacting a general read device close to a magnetic nano-line can be resolved, and a problem of determining a first bit of the burst data can be resolved.

Embodiments are provided below for describing the application in detail, thought the application is not limited to the provided embodiments, and the provided embodiments can be mutually combined, suitably.

Figure 5:
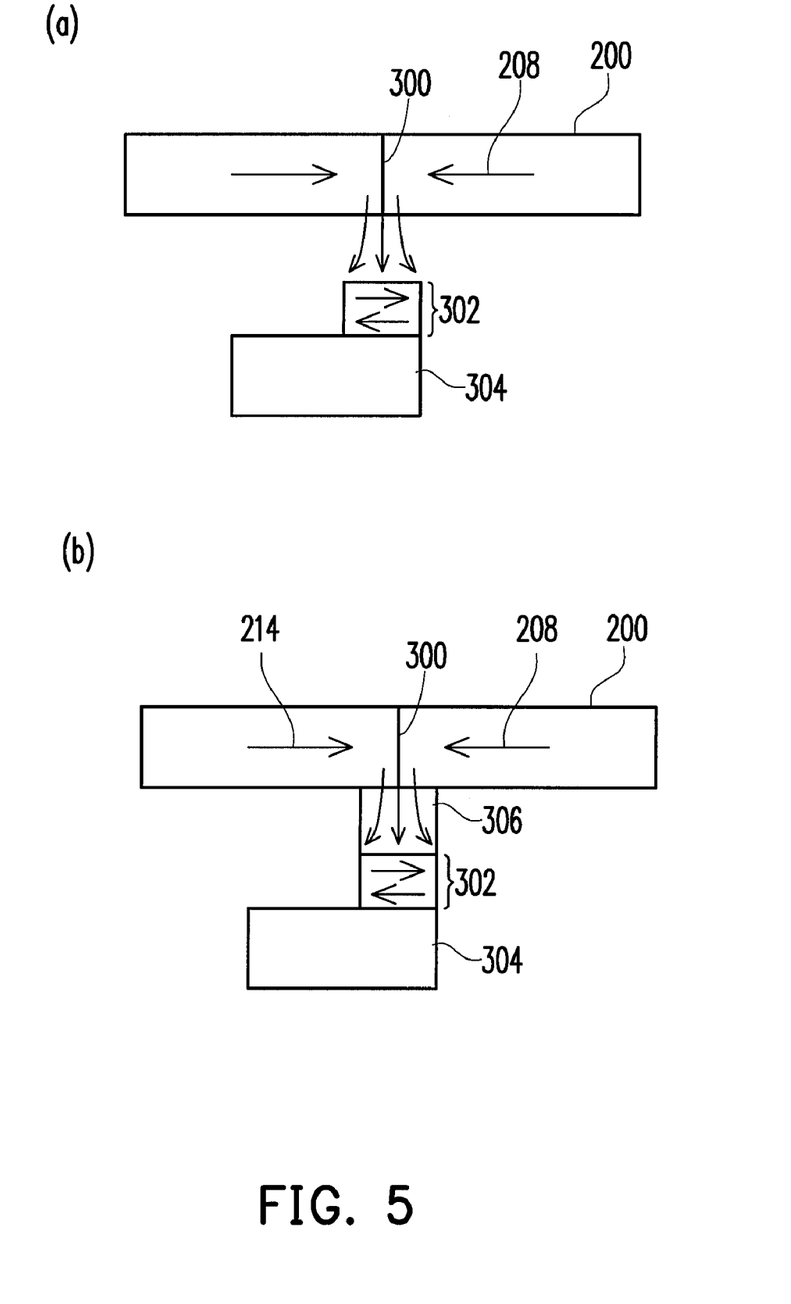
FIG. 5 is a schematic diagram illustrating a mechanism for reading stored data according to an embodiment.

FIG. 5 is a schematic diagram illustrating a mechanism for reading stored data according to an embodiment. Referring to FIG. 5(a), first, the horizontal anisotropic material magnetic shift register is taken as an example. In the embodiment, the domain wall fringe field is used to determine a value of the stored data. Therefore, a read device 302 is disposed corresponding to an interface 300 of two adjacent magnetic domains 200. When magnetization directions 208 of the two adjacent magnetic domains 200 are opposite (for example, head to head), a domain wall is generated at the interface 300 of the magnetic domain, and a direction of the fringe field thereof is outward. Therefore, the read device 302 can sense the fringe field without contacting the interface 300 of two adjacent magnetic domains 200. The read device 302 is connected to a peripheral reading circuit through a metal electrode 304, and obtains a magnetoresistance value. Referring to FIG. 5(b), besides a non-contacting design of FIG. 5(a), a metal conductive material 306 can be added to facilitate reducing a distance between the read device and the magnetic track, so as to enlarge a sensing signal.

Figure 6:
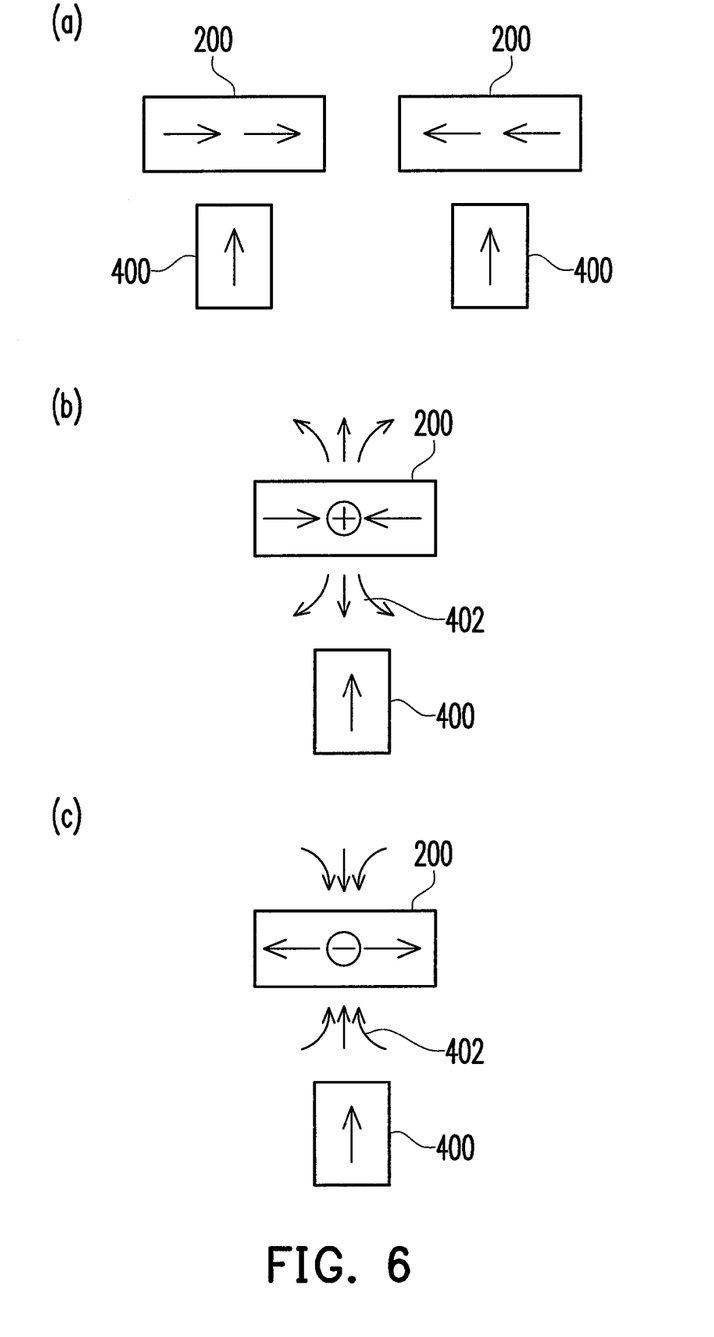
FIG. 6 is a schematic diagram illustrating four states of a fringe field of a horizontal anisotropic material magnetic shift register according to an embodiment.
Figure 7:
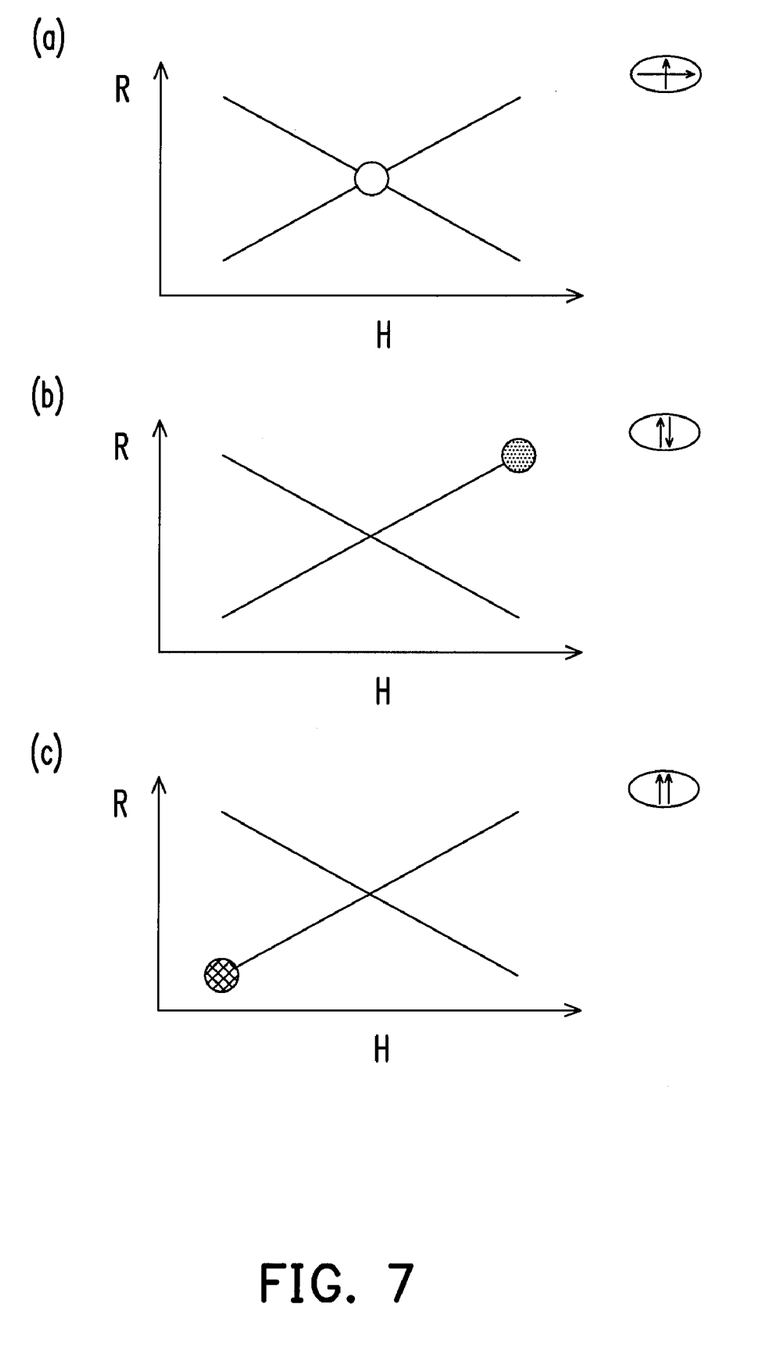
FIG. 7 is a labeled diagram corresponding to four states of a fringe field of FIG. 6.

FIG. 6 is a schematic diagram illustrating four states of the fringe field of the horizontal anisotropic material magnetic shift register according to an embodiment. FIG. 7 is a labeled diagram corresponding to the four states of the fringe field of FIG. 6. Referring to FIG. 6(a), the magnetization directions of the two adjacent magnetic domains are the same, which have a head to tail state or a tail to head state. In case of these two states, since the magnetization directions are the same, no domain wall is generated, so that there is substantially no fringe field, which is a so-called non-fringe field state of the embodiment. Therefore, a read device 400 is, for example, disposed below the magnetic domain, and a magnetization direction of a reference layer of the read device thereof is, for example, upward. Referring to FIG. 7(a), since there is not fringe field at the present, magnetization directions of the pinned reference layer and a free layer of the read device 400 are orthogonal, and the sensed magnetoresistance (R) has a middle state. Now, the stored data cannot be determined only according to the magnetoresistance value.

Referring to FIG. 6(b) and FIG. 7(b), the magnetization directions of the adjacent magnetic domains are in a state of head to head, so that a fringe field 402 is generated, and a direction of a magnetic field thereof is outward. Accordingly, the magnetization directions of the pinned reference layer and the free layer of the read device 400 are anti-parallel, and a relatively great magnetoresistance value is generated. Therefore, the magnetoresistance (R) of FIG. 7(b) has a high magnetoresistance state, which represents a stored data of "1".

Referring to FIG. 6(c) and FIG. 7(c), the magnetization directions of the adjacent magnetic domains are in a state of tail to tail, so that the fringe field 402 is generated, and a direction of the magnetic field thereof is inward. Accordingly, the magnetization directions of the pinned reference layer and the free layer of the read device 400 are parallel, and a relatively small magnetoresistance value is generated. Therefore, the magnetoresistance (R) of FIG. 7(c) has a low magnetoresistance state, which represents a stored data of "0".

A more detailed mechanism is described as follows. Regarding a magnetic head device well known in a hard disc industry, the free layer and the reference layer thereof are mutually orthogonal, so as to obtain an optimal linear reading characteristic. FIG. 7 illustrates magnetoresistance vs. magnetic field (R-H) characteristic curves and magnetization directions of the reference layer and the free layer of such kind of read device. Since the free layer and the reference layer of the read device are orthogonal, when the read device is not affected by the magnetic field, the magnetoresistance thereof has the middle state (Rmid=2/(1/Rhigh+1/Rlow)). When the magnetic field has as a positive direction, the free layer is deflected, which may probably enlarge an angle between the free layer and the reference layer, so that the magnetoresistance may trend to be Rhigh, as that shown in FIG. 7(b), which represents a data of "1". When the magnetic field has a negative direction, the free layer is deflected towards another direction, which may probably reduce an angle between the free layer and the reference layer, so that the magnetoresistance may trend to be Rlow, as that shown in FIG. 7(c), which represents a data of "0". These three cases correspond to the fringe fields generated at the domain wall area, and the domain wall is formed by two adjacent bits storing different type of datum. When the two adjacent bits store data of the same type (for example, the rightward magnetization direction represents the bit data of 1, and the leftward magnetization direction represents the bit data of 0), and in case that the two bit data are 1+1 and 0+0, no domain wall is generated, so that no domain wall fringe field is generated. In this case, the read device is not affected by the magnetic field, and has the middle state. In case that the two adjacent bit data are 1+0 (i.e. the magnetization directions are in the state of head to head), the domain wall is formed, which can be regarded to have a positive magnetic charge, so that the fringe field is divergent from the domain wall area (+Hx, +Hy, +Hz). Now, the read device probably reads the bit data of 1. In case that the two adjacent bit data are 0+1 (i.e. the magnetization directions are in the state of tail to tail), the domain wall is also formed, which can be regarded to have a negative magnetic charge, and the fringe field is convergent towards the domain wall area (−Hx, −Hy, −Hz). Now, the read device probably read the bit data of 0.

Figure 8:
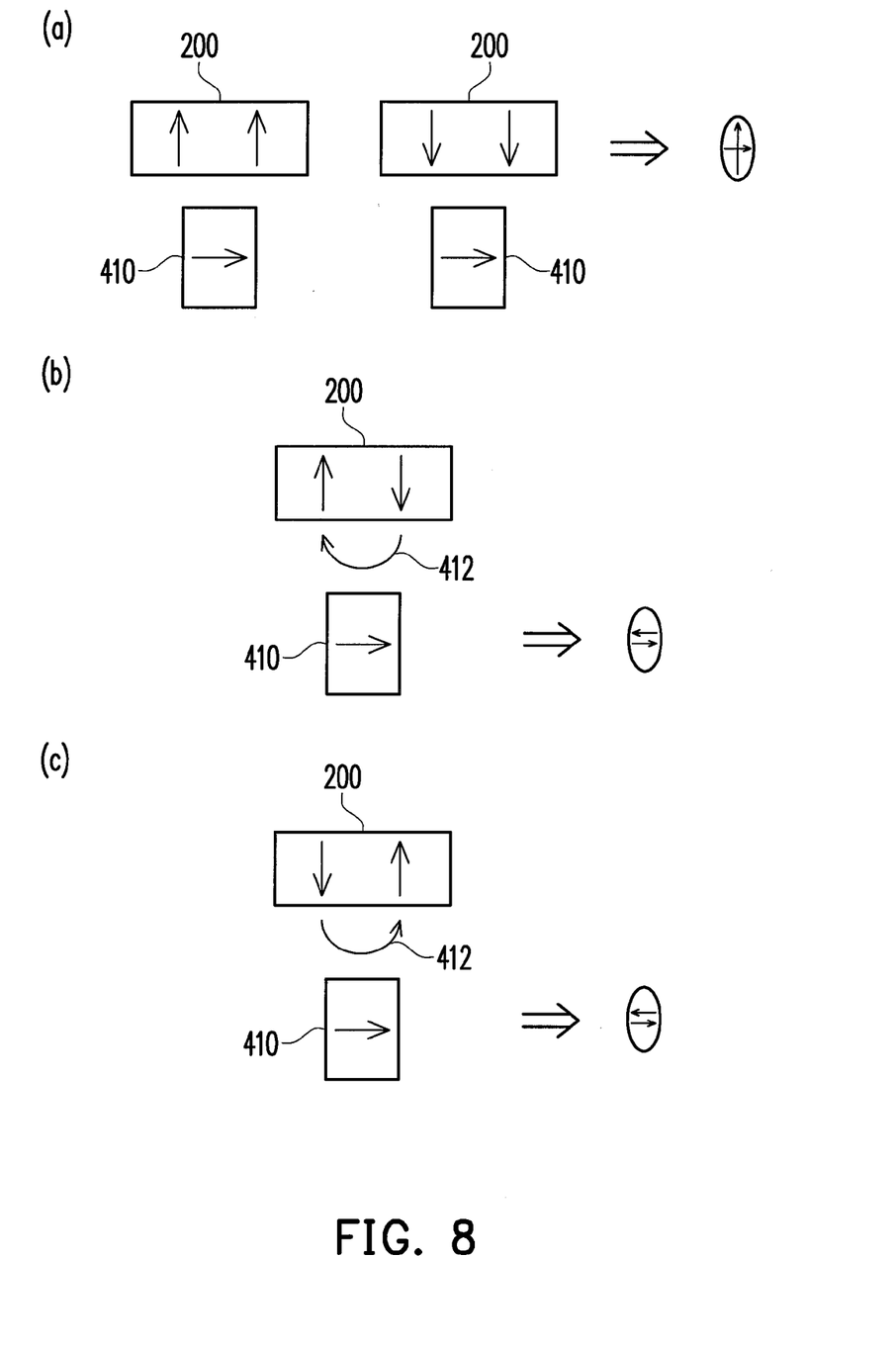
FIG. 8 is a schematic diagram illustrating four states of a fringe field of a perpendicular anisotropic material magnetic shift register according to an embodiment.

The above mechanism can also be applied to the perpendicular anisotropic material magnetic shift register. FIG. 8 is a schematic diagram illustrating four states of the fringe field of the perpendicular anisotropic material magnetic shift register according to an embodiment. Referring to FIG. 8(a), the magnetization directions of the two adjacent magnetic domains 200 are all, for example, upward or downward, so that no domain wall is generated, and therefore there is no fringe field 412. If the read device 410 is also disposed below the interface of the magnetic domain, and the magnetization direction of the reference layer thereof is, for example, rightward, the sensed magnetoresistance is in the middle state, and whether the magnetization directions of the two adjacent magnetic domains are upward or downward cannot be distinguished.

Referring to FIG. 8(b), when the magnetization direction of a left one of the two adjacent magnetic domains 200 is, for example, upward, and the magnetization direction of a right one of the two adjacent magnetic domains 200 is, for example, downward, the domain wall is generated, and therefore a leftward fringe field is generated. Now, the magnetization directions of the reference layer and the free layer of the read device 410 are anti-parallel, and a relatively great magnetoresistance value is generated.

Referring to FIG. 8(c), when the magnetization direction of the left one of the two adjacent magnetic domains 200 is downward, and the magnetization direction of the right one of the two adjacent magnetic domains 200 is upward, the domain wall is also generated, and therefore a rightward fringe, field is generated. Now, the magnetization directions of the reference layer and the free layer of the read device 410 are parallel, and a relatively low magnetoresistance value is generated.

Figure 9:
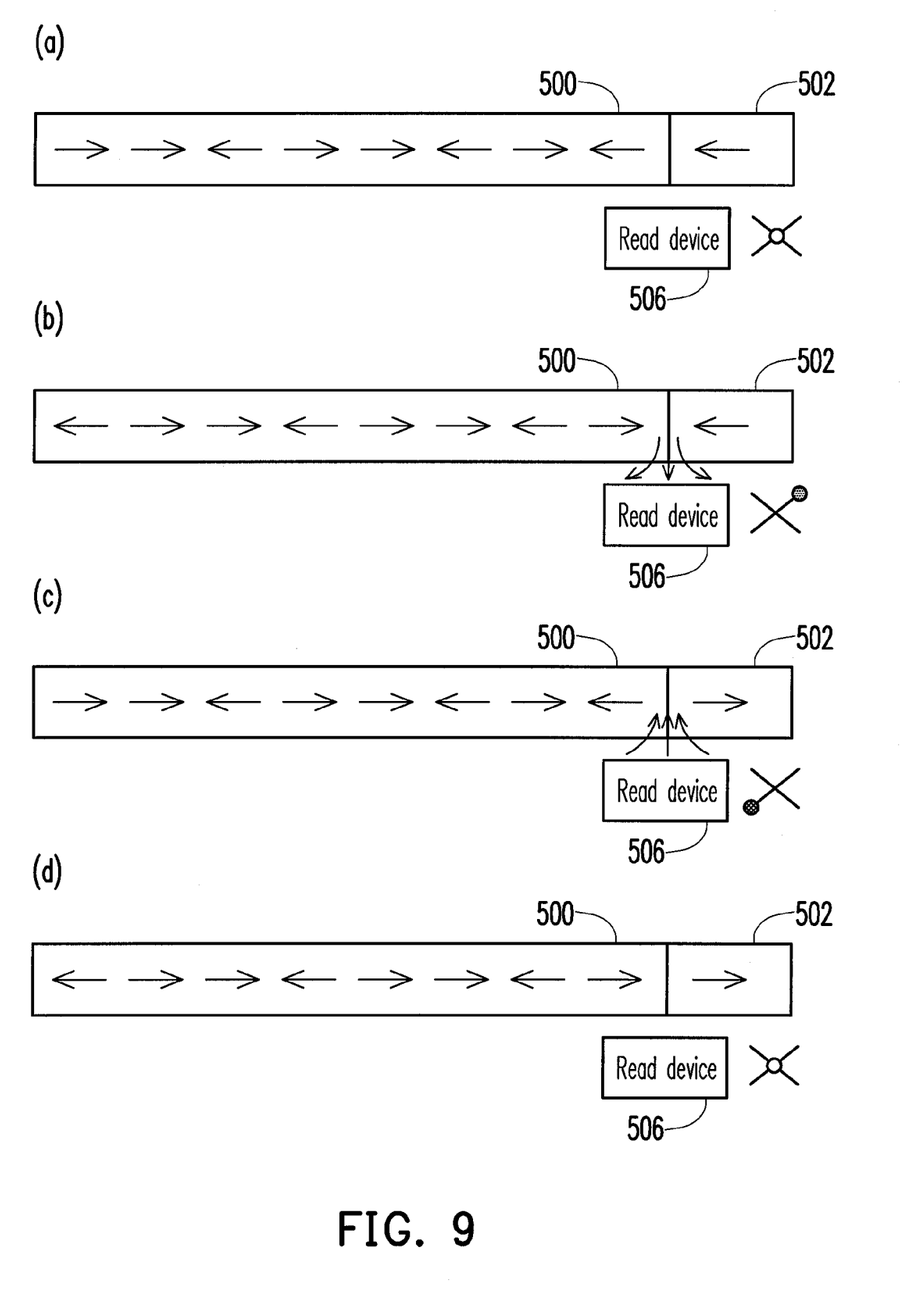
FIG. 9 is a diagram illustrating configurations of a magnetic shift register and a read device according to an embodiment.

According to the above mechanism, in an application of the magnetic shift register, the read device is configured corresponding to a magnetic track of the magnetic shift register. FIG. 9 is a diagram illustrating configurations of the magnetic shift register and the read device according to an embodiment. Referring to FIG. 9(*a*), the magnetic shift register generally includes at least one magnetic track. Each magnetic track has at least one set of burst data 500 formed by a plurality of consecutive magnetic domains. Each magnetic domain has a magnetization direction corresponding to a stored data. A head magnetic domain 502 having a given magnetization direction corresponding to a given stored data is set at the most front of the set of burst data 500, and the head magnetic domain 502 and the set of burst data 500 form a data storage unit.

While reading the stored data of the first magnetic domain of the burst data 500, the domains are shifted by applying the driving current. Now, the read device 506 is located on an interface between a first magnetic domain of the burst data 500 and the head magnetic domain 502. The read device 506 can read the magnetoresistance value through a peripheral circuit, and convert it into an output logic state of a sensing circuit. As shown in FIG. 9(*a*), no domain wall is generated, so that there is no fringe field. Therefore, the magnetoresistance value sensed by the read device 506 is less than a threshold value, so that the output logic state of the sensing circuit is maintained unchanged. Now, the magnetization direction and the stored data of the first magnetic domain of the burst data 500 are the same to that of the head magnetic domain 502 (for example, the leftward magnetization direction represents "0", and the rightward magnetization direction represents "1"). Therefore, the first stored data of the burst data 500 can be correctly determined.

Figure 10:
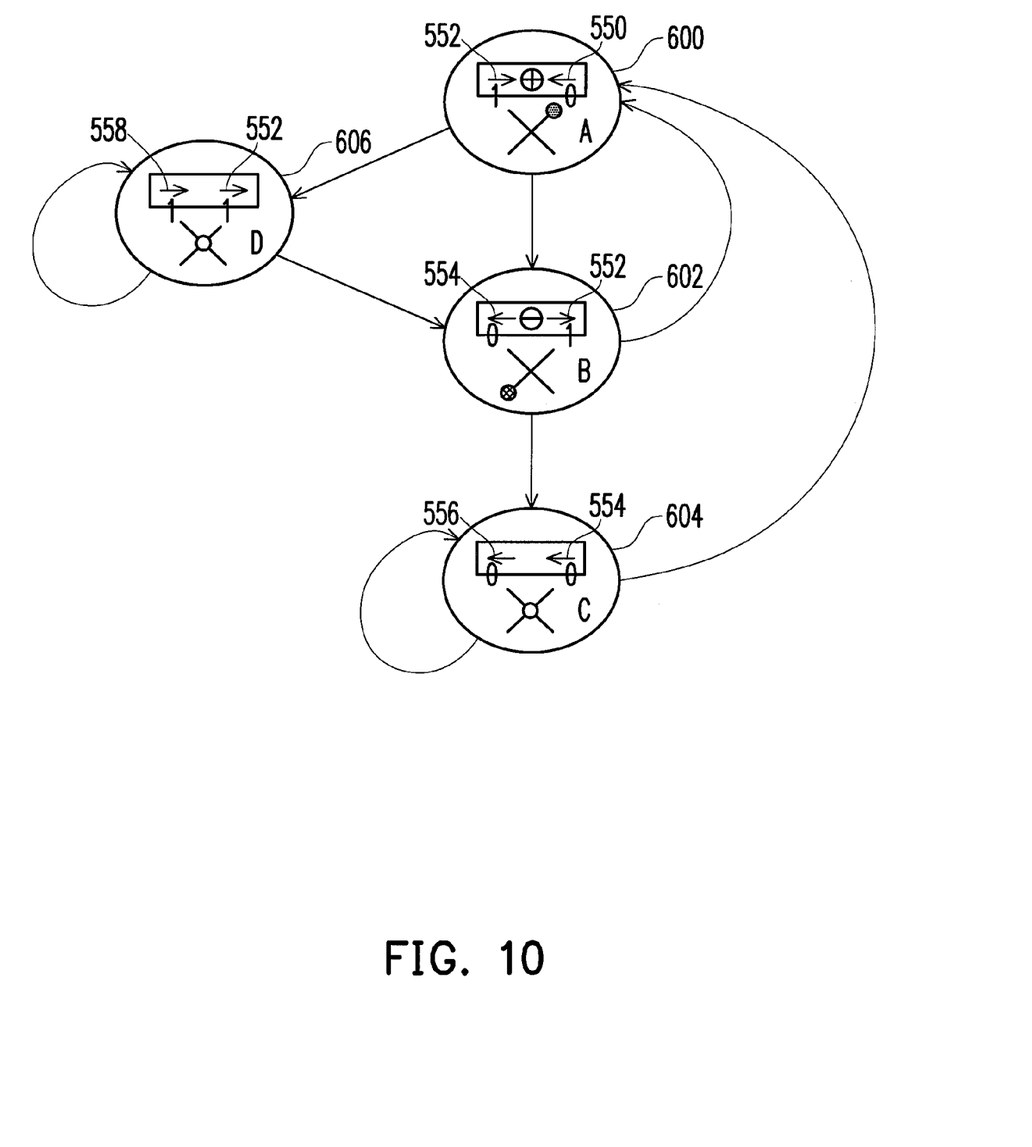
FIG. 10 is a schematic diagram illustrating a mechanism of determining data according to an embodiment.

If the other data of the burst data 500 is continually read, the magnetic domains composed of the burst data 500 and the head magnetic domain 502 are shifted towards the read device 506 one magnetic domain at a time. Since a previous magnetic domain corresponding to the currently read magnetic domain is shifted to a position where the head magnetic domain 502 is originally located, and the stored bit data has been read, the data of the other magnetic domains of the burst data 500 can be correctly read. An embodiment of a data determining method is illustrated in FIG. 10.

FIG. 9(*b*) illustrates another initial status, referring to FIG. 9(*b*), the data of the first magnetic domain of the burst data 500 is rightward, so that a domain wall is generated between the first magnetic domain and the head magnetic domain 502, and accordingly the fringe field is generated. According to the simplified read device 506, since a sensing circuit signal generated by the fringe field is greater than the threshold value, it is great enough to change the output logic state of the sensing circuit. Therefore, the data of the first magnetic domain of the burst data 500 can be correctly determined to be inversed to the data of the head magnetic domain 502, and the magnetization direction thereof is rightward.

According to FIG. 9(*c*), the head magnetic domain 502 has a given rightward magnetization direction. Therefore, if the magnetization direction of the first magnetic domain of the burst data 500 is leftward, the fringe field is also generated, though a direction of the generated magnetic field is inversed to that of FIG. 9(*b*). Now, since the sensing circuit signal generated by the fringe field is also greater than the threshold value, the output logic state of the read device 506 is transited, and the data of the leftward magnetization direction can be correctly determined.

Referring to FIG. 9(*d*), the head magnetic domain 502 also has a given rightward magnetization direction. If the data of the first magnetic domain of the burst data 500 is rightward, no fringe field is generated, so that the output logic state of the read device 506 is maintained, and the data of the rightward magnetization direction can be correctly determined.

According to the above description, a function of the read device 506 can be changed according to an actual demand, and a read device can be applied as long as it can sense the fringe field generated by the domain wall. A design of the head magnetic domain 502 facilitates correctly determining the data of the first magnetic domain of the burst data 500, and the follow-up data can be correctly read according to the same mechanism.

FIG. 10 is a schematic diagram illustrating a mechanism of determining data according to an embodiment. Referring to FIG. 10, the methods for dynamically read the data of the magnetic shift register can be simplified into four cases, and various combinations of the domain wall motion and the domain wall fringe field that cause generation of a read device signal include states of A, B, C and D.

The read device can be connected to the peripheral sensing circuit through a bit line, and the sensing circuit can, for example, change a latched data thereof according to an amplified differential signal. Generally, the differential signal, for example, has a 100 mV level, which is the threshold value. When the domain wall is generated, the read device may have the Rhigh state or the Rlow state under an effect of the fringe field, which can change the data latched by the sense amplifier to 1 or 0. However, when the domain wall is not generated, the read device may have the Rmid state without being affected by the fringe field, and the sensed signal is not great enough to change the latched data, so that the sense amplifier maintains the originally stored data. If a previous bit is data 1, it represents that the current bit is still the data 1, so that the domain wall is not generated, and a value of the sense amplifier is unchanged.

Taking a state mechanism as an example, assuming A 600 has an initial state of head to head, a leftward magnetization direction 550, for example, represents data "0", and a rightward magnetization direction 552 of the adjacent magnetic domain represents data "1". Now, the read device can read a result that the magnetization direction 552 has the Rhigh state (data 1), and now the output of the sense amplifier is 1, which represents the stored data of the left bit is 1 (the magnetization direction thereof is rightward). Assuming that a driving current causes a rightward domain wall motion, in one driving pulse, the bits stored in the magnetic domains are all shifted rightwards by one bit. Here, only two adjacent bits located near the read device are illustrated. When the state A 600 is changed to a state B 602, a magnetization direction 554 of a newly entered bit is leftward, so that a tail to tail domain wall state B 602 is formed between the newly entered bit and the previous bit. Now, the read device can read a result of Rlow, and the peripheral sensing circuit can determine a result of data 0. The result of data 0 corresponds to a leftward magnetization direction of a left bit. The other states such as a state C 604 is obtained by right-shifting the state B 602, and a magnetization direction 556 of a newly entered bit thereof and the magnetization direction 554 are all leftward. A state D 606 is obtained by right-shifting the state A 600, and a magnetization direction 558 of a newly entered bit thereof and the magnetization direction 552 are all rightward. When any state enters the state A 600, for example, B→A or C→A, and when any state enters the state B 602, for example, D→B or A→B, the read device can read the Rhigh state or the Rlow state, so that the sense amplifier is changed to a correct state for corresponding to the stored data of the left bit. However, when the states without the domain wall is entered, for example, A→D, D→D, B→C, C→C, the read device all reads the Rmid state, and now the differential amplification is inadequate to change the previous data recorded by the sense amplifier. In such case, no domain wall is generated, which represents a next data is the same to a previous data (the magnetization directions thereof are all rightward or leftward), and the read value of the sense amplifier is maintained. Started from the state A 600, a follow-up state thereof can be the state B 602 or the state D 606. Similarly, started from the state B 602, a follow-up state thereof can be the state A 600 or the state C 604. Started from the state C 604, a follow-up state thereof can be the state C 604 or the state A 600. Started from the state D 606, a follow-up state thereof can be the state D 606 or the state B 602.

According to the above read flow, determination of data is the same to that of a general memory, and the output of the sense amplifier represents each of the bit data. If the initial state is the state A 600 or the state B 602, the data can be correctly determined. Though, if the initial state is the state C 604 or the state D 606, the data cannot be determined, and another mechanism has to be used for the determination.

As described above, the head magnetic domain can be added to the magnetic shift register, by which a bit data with a given state (which is also referred to as a heading bit, for example, the magnetization direction 550) is first allocated, and a state circuit can start a read operation from the first bit. In case of the state A 600 and the state B 602, the data can be correctly determined. If the initial state is the state D 606 or the state C 604, and an initial value of the sense amplifier is the same to the heading bit, a right-side magnetic domain stores the heading bit, and the magnetization direction thereof is known. There is no domain wall formed between the first bit data of the burst data and the heading bit, and since the initial value of the sense amplifier is "0" (the state C 604) or "1" (the state D 606), the differential signal is inadequate to change the value of the sense amplifier, so that a same data of the sense amplifier is output. By such means, even if the initial state is the state D 606 or the state C 604, the data can still be correctly determined. Certainly, one bit of the burst data can also be determined according to other methods, though the other methods are probably more complicated.

In the embodiment, the read device is disposed on the interface of the magnetic domains, and the read device can read bit data by detecting the fringe field. Further, to correctly determine the first bit of the burst data, the given heading bit of the head magnetic domain can be applied for the determination.

The embodiment is directed to a magnetic shift register structure and a reading method thereof, which can determine bit data stored in a magnetic domain by detecting whether there is a fringe field on an interface of two adjacent magnetic domains.

It will be apparent to those skilled in the art that various modifications and variations can be made to the structure of the embodiment without departing from the scope or spirit of the embodiment. In view of the foregoing, it is intended that the embodiment cover modifications and variations of this embodiment provided they fall within the scope of the following claims and their equivalents.

What is claimed is:

1. A magnetic shift register, comprising:
   at least one magnetic track having at least one set of burst data formed by a plurality of consecutive magnetic domains, and each magnetic domain having a magnetization direction corresponding to a stored data; and
   a head magnetic domain having a given magnetization direction corresponding to a given stored data being set at a most front of the set of burst data, and the head magnetic domain and the set of burst data forming a data storage unit,
   wherein a read device is disposed on a boundary of an adjacent magnetic domain, so as to detect a state of a fringe field.

2. The magnetic shift register as claimed in claim 1, wherein the magnetization direction is perpendicular or parallel to the magnetic track.

3. The magnetic shift register as claimed in claim 1, wherein the magnetic domains of the magnetic track are shifted towards the head magnetic domain during a read operation.

4. The magnetic shift register as claimed in claim 1, wherein after the read device determines a first bit data of the set of the burst data according to the head magnetic domain, the read device determines the magnetization direction of the next magnetic domain according to the magnetization direction of the previous magnetic domain, so as to obtain the stored data of the next magnetic domain.

5. A method for reading a magnetic shift register, wherein the magnetic shift register comprises: at least one magnetic track having at least one set of burst data formed by a plurality of consecutive magnetic domains, and each magnetic domain has a magnetization direction corresponding to a stored data; a head magnetic domain having a given magnetization direction being set at a most front of the set of burst data; and a read device disposed at a boundary of an adjacent magnetic domain for detecting a fringe field state, and the method comprises:
   sequentially shifting the stored data of the magnetic domains on the magnetic track towards the head magnetic domain, and performing a read operation for each shifting, the read operation comprising:
   reading the stored data of a first magnetic domain by the read device, wherein the data is determined according to the fringe field state generated by the front magnetic domain and the first magnetic domain of the set of burst data; and
   sequentially reading the other stored data of the set of burst data, wherein with reference of the stored data of the first magnetic domain and a rule, the stored data in the current magnetic domain is determined by the read stored data in the previous magnetic domain according to the currently detected fringe field state.

6. The method for reading the magnetic shift register as claimed in claim 5, wherein the read device detects the fringe field state to obtain one of a middle magnetoresistance state, a high magnetoresistance state and a low magnetoresistance state.

7. The method for reading the magnetic shift register as claimed in claim 5, wherein the read device detects the fringe field state to obtain a middle magnetoresistance state or a high magnetoresistance state, wherein the middle magnetoresistance state corresponds to a situation of having no fringe field, and the high magnetoresistance state corresponds to a situation of having a positive direction fringe field or a negative direction fringe field.

8. The method for reading the magnetic shift register as claimed in claim 5, wherein the magnetization direction is perpendicular or parallel to the magnetic track.

9. The method for reading the magnetic shift register as claimed in claim 5, wherein a determination condition of the stored data of the first magnetic domain comprises:

the stored data of the first magnetic domain being the same to the given stored data of the head magnetic domain if the fringe field state of the first magnetic domain indicates there is no fringe field; and the stored data of the first magnetic domain being inversed to the given stored data of the head magnetic domain if the fringe field state of the first magnetic domain indicates there is the fringe field.

10. The method for reading the magnetic shift register as claimed in claim 9, wherein the rule of sequentially reading the other stored data of the set of burst data comprises:

taking the stored data of the previous magnetic domain as a reference data;

the stored data of the currently read magnetic domain being the same to the reference data if the fringe field state indicates there is no fringe field; and the stored data of the currently read magnetic domain being inversed to the reference data if the fringe field state indicates there is the fringe field.

11. The method for reading the magnetic shift register as claimed in claim 5, wherein the read device is a magnetic field reading device having two output states, wherein the read device is not transited when no fringe field is sensed, and conversely the read device is transited when the fringe field is sensed.

12. A method for reading a magnetic shift register, wherein the magnetic shift register comprises: at least one magnetic track having at least one set of burst data formed by a plurality of consecutive magnetic domains, and each magnetic domain having a magnetization direction corresponding to a stored data, the method comprising:

setting a given magnetization direction to a head magnetic domain, wherein the head magnetic domain is a most front one of the magnetic domains of the burst data and stores an already-known binary data according to the given magnetization direction;

sequentially moving a plurality of interfaces between the magnetic domains to pass through a read position;

shifting the stored data of the magnetic domains one bit at a time, so that the set of burst data sequentially passes through the read position according to motions of the magnetic domains;

detecting whether there is a fringe field at the read position, and determining the stored data of the currently read magnetic domain according to a rule, wherein the rule comprises:

the stored data of the currently read magnetic domain being the same to the stored data of the previous magnetic domain if no fringe field is detected at the read position; and the stored data of the currently read magnetic domain being inversed to the stored data of the previous magnetic domain if the fringe field is detected at the read position.

13. The method for reading the magnetic shift register as claimed in claim 12, wherein a method of detecting whether there is a fringe field at the read position comprises configuring a read device to detect whether there is the fringe field.

14. The method for reading the magnetic shift register as claimed in claim 13, wherein the read device has a magnetoresistance threshold value, and has a low magnetoresistance state and a high magnetoresistance state, the read device has a pre-detection state corresponding to one of the low magnetoresistance state and the high magnetoresistance state, and the read device performs following operations:

maintaining the pre-detection state when a detected magnetoresistance value corresponds to a situation of having no fringe field, and is less than the magnetoresistance threshold value; and changing the pre-detection state to another state when the detected magnetoresistance value corresponds to a situation of having the fringe field, and is greater than the magnetoresistance threshold value.

15. The method for reading the magnetic shift register as claimed in claim 14, wherein whether there is the fringe field is determined according to whether the read device is transited.

16. The method for reading the magnetic shift register as claimed in claim 14, wherein the magnetization direction is perpendicular or parallel to the magnetic track.

17. The method for reading the magnetic shift register as claimed in claim 14 further comprising:

determining the stored data of a first magnetic domain of the set of the burst data according to a given magnetization direction.

* * * * *